United States Patent
Nguyen et al.

[11] Patent Number: 6,154,051
[45] Date of Patent: Nov. 28, 2000

[54] TILEABLE AND COMPACT LAYOUT FOR SUPER VARIABLE GRAIN BLOCKS WITHIN FPGA DEVICE

[75] Inventors: Bai Nguyen, San Jose; Om P. Agrawal, Los Altos; Bradley A. Sharpe-Geisler, San Jose; Jack T. Wong, Fremont; Herman M. Chang, Cupertino; Giap H. Tran, San Jose, all of Calif.

[73] Assignee: Vantis Corporation, Sunnyvale, Calif.

[21] Appl. No.: 09/187,689

[22] Filed: Nov. 5, 1998

[51] Int. Cl.[7] .......................... H03K 19/177; H01L 25/00

[52] U.S. Cl. ................................ 326/41; 326/47

[58] Field of Search .................. 326/37–39, 41, 326/47, 101

[56] References Cited

U.S. PATENT DOCUMENTS

| | | | |
|---|---|---|---|
| 5,239,215 | 8/1993 | Yamaguchi | 327/292 |
| 5,537,057 | 7/1996 | Leong et al. | 326/41 |
| 5,581,199 | 12/1996 | Pierce et al. | 326/41 |
| 5,598,109 | 1/1997 | Leong et al. | 326/41 |
| 5,900,743 | 5/1999 | McClintock et al. | 326/41 |

FOREIGN PATENT DOCUMENTS 2 318 663   4/1998   United Kingdom ......... H03K 19/177

*Primary Examiner*—Michael Tokar
*Assistant Examiner*—James H Cho
*Attorney, Agent, or Firm*—Fliesler, Dubb, Meyer & Lovejoy LLP

[57] ABSTRACT

A tileable structure is provided for logic array devices. The tileable structure has a mirror-symmetrical arrangement of sets of logic blocks, common control sections for the logic block sets, surrounding interconnect lines, and switching areas at intersections of the interconnect lines.

22 Claims, 11 Drawing Sheets

TILEABLE AND COMPACT LAYOUT FOR SUPER VARIABLE GRAIN BLOCKS WITHIN FPGA DEVICE

CROSS REFERENCE TO RELATED APPLICATIONS

The following co-pending U.S. patent applications(s) are related to the present application and their disclosures are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,612 filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";

(F) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS"; and, (G) Ser. No. 08/996,049 filed Dec. 22, 1997 by Om P. Agrawal et al. and originally entitled, "DUAL PORT SRAM MEMORY FOR RUN-TIME USE IN FPGA INTEGRATED CIRCUITS;

CROSS REFERENCE TO RELATED PATENTS

The following U.S. patent(s) are related to the present application and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

BACKGROUND

1. Field of the Invention

The invention relates generally to integrated circuits having repeated logic and interconnect structures provided therein. The invention relates more specifically to physical layouts for field programmable gate arrays (FPGA's).

2. Description of Related Art

As the density of digital logic circuitry within integrated circuits (IC's) increases, and as the signal-processing speed of such logic also increases, the ability of interconnect to route all signals in timely fashion between spaced-apart logic sections becomes more important to proper operation of the integrated circuit.

Physical layout within each logic section of an IC device may play a critical role in defining the signal-processing speed of the section. Device performance may also be affected by the physical separation between critical logic sections. Device performance may be further affected by the interplay between interconnect layout and logic layout.

More specifically, when it comes to the field of programmable logic arrays, artisans have begun to recognize that conductors of different lengths and orientations should be provided for servicing different kinds of signals. By way of example, a first class of relatively long, low resistance conductors may be provided for broadcasting common control signals (e.g., clock, clock enable, etc.) over relatively large distances of the IC device with minimal skew. Such special conductors are sometimes referred to as low-skew longlines. Artisans have also begun to realize that significantly shorter wire segments should be dedicated for transmitting logic input and logic output signals between immediately adjacent logic sections. These dedicated conductors are sometimes referred to as direct-connect lines.

At the same time, artisans wish to provide field programmable logic arrays with general-purpose conductors and general-purpose routing switches for carrying out general-purpose, programmable routing of signals.

This evolution toward using both general purpose and special purpose conductors within the interconnect portion of logic arrays needs to mesh with the concurrent evolution of logic circuits. The logic circuitry of logic array IC's is consistently evolving towards faster signal processing speeds and greater per area densities of logic functionalities. This confluence of developments has created a need for a physical layout of both interconnect and logic circuitry where such a layout efficiently accommodates design specifications for timing and processing of broadcast control signals, of high-speed local signals, and also of randomly-routed, general purpose signals.

SUMMARY OF THE INVENTION

An improved layout in accordance with the invention features a repeating pattern of logic-implementing, Super Logic Blocks or 'SLB's'. Each SLB includes one or more sets of uniformly-distributed logic blocks and for each such set, a common control section that defines and uniformly distributes common control signals for its respective set of logic blocks.

In one embodiment, each such SLB may be defined either as a Super Variable Grain Block (SVGB) or a symmetric division thereof which is referred to as a VGB (Variable Grain Block). Each VGB has an L-shaped, uniform distribution of logic blocks (CBB's) and a common control section centrally-located within the L-shape for servicing those CBB's (Configurable Building Blocks).

More generally, the logic blocks of each commonly-controlled set within an SLB should be arranged in symmetry about the respective common control section such that signal propagating delay from the common control section to each of its respective logic blocks can be essentially the same. Each common control section has control-origin acquiring means associated therewith for acquiring control-originating signals from adjacent interconnect. The common control section uses the acquired control-originating signals for deriving the common control signals that will be uniformly distributed to the logic blocks of its set.

The control-origin acquiring means associated with each common control section extends over interconnect channels that are disposed symmetrically adjacent to that common control section so that each common control section can acquire control-originating signals with substantially same timing from the adjacent interconnect channels. Interconnect channels contain both varied-purpose conductors (e.g., longlines, general routing lines) and switching areas for programmably interconnecting the varied-purpose conductors thereof. These interconnect channels surround the SLB's. In addition to the control-origin acquiring means, further input-signal acquiring means of each SLB extend as tentacles out over the adjacent channels for acquiring respective control-originating and input-term signals from the varied-purpose conductors within the interconnect channel. A repeatably tileable structure is formed by the combination of the SLB and its adjoining channel portions.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1A:
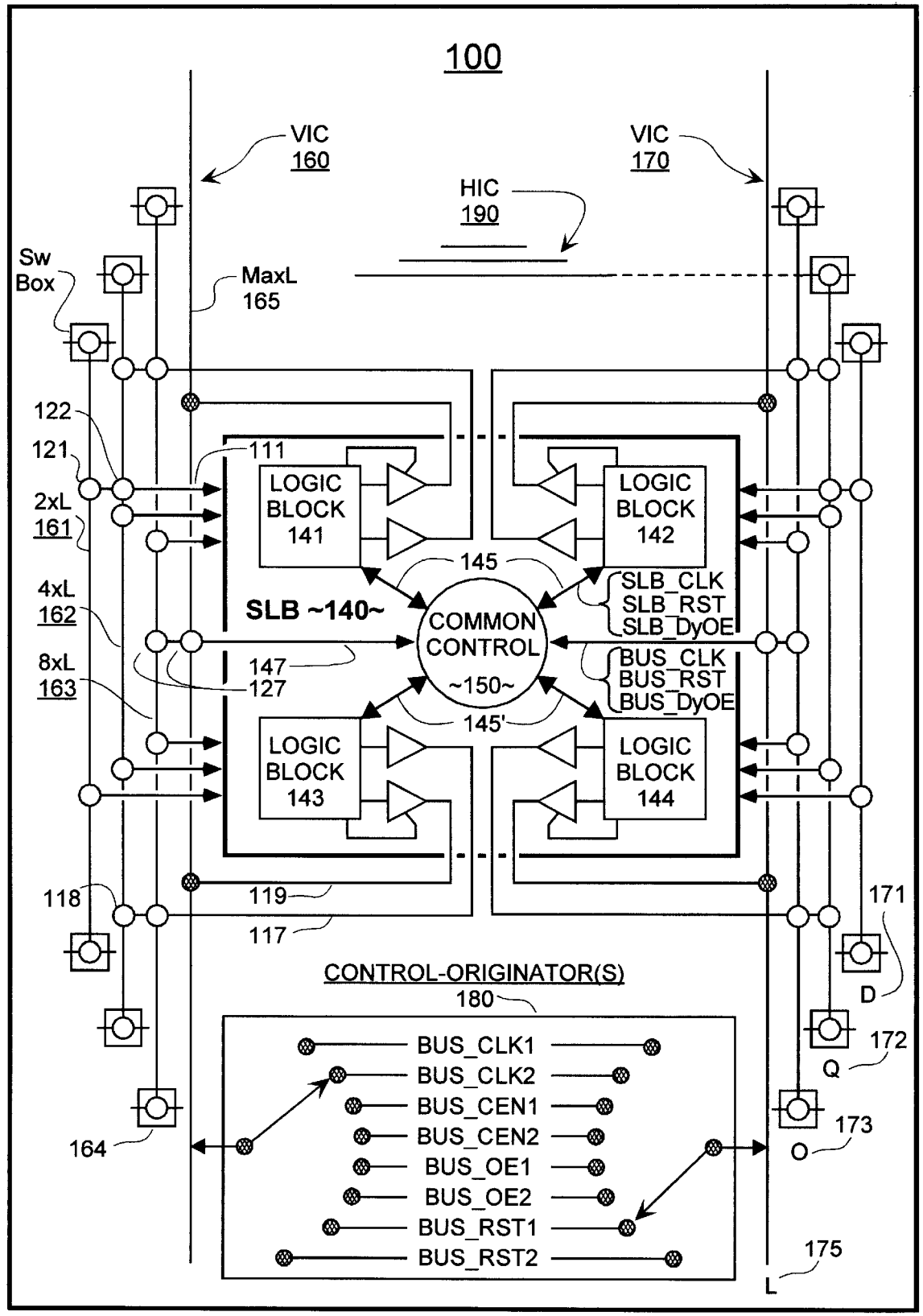
FIG. 1A illustrates a first example of a super logic block (SLB) as may be provided within an integrated circuit device and surrounded by interconnect of variable length resources.

FIG. 1A shows a first integrated circuit device 100 in accordance with the invention. Device 100 has a plurality of super logic blocks (SLB's) distributed therein to define rows and columns. For the sake of illustrative brevity, only one such SLB 140 is shown. The SLB 140 is positioned adjacent to at least two 'channels' of interconnect (e.g., vertical VIC 160 and horizontal HIC 190) as will be explained below.

Each of the plural SLB's of device 100 includes a common control section 150 and a plurality of logic blocks 141, 142, 143 and 144, with the logic blocks being distributed symmetrically relative to the common control section 150. A control signal distribution network 145 fans out uniformly from the common control section 150 for uniformly distributing a same set of control signals 145' to the logic blocks 141–144.

By way of example, the control signals 145' that are commonly distributed by network 145 may include the following as indicated in the illustration: (a) an SLB-local clock signal, SLB_CLK; (b) an SLB-local reset signal, SLB_RST; and (c) a dynamically-changeable SLB-output enable signal, SLB_DyOE. A further example may be a clock-enable signal (CEN) such as indicated in originator(s) portion 180 of the figure.

Each SLB 140 (only one shown) further includes a plurality of control-acquiring means, such as represented by line 147, for selectively acquiring control-origin signals from adjacent interconnect buses. The acquired control-origin signals may include one or more of a bus-supplied clock signal (BUS_CLK1 or BUS_CLK2), a bus-supplied reset signal (BUS_RST1 or BUS_RST2), a bus-supplied output enable signal (BUS_OE1 or BUS_OE2), and a bus-supplied clock enable signal (BUS_CEN1 or BUS_CEN2). These bus-supplied control-origin signals may originate from one or more control-originator circuits. The control originator(s) are schematically shown at 180 although they do not need to be so located as a collective. Switches within the originators area 180 represent an ability within device 100 to programmably select which control-origin signals, if any, should be placed on which interconnect lines.

The adjacent interconnect channels of each SLB are exemplified by a first vertical interconnect channel (VIC) 160 drawn on the left and a second VIC 170 drawn on the right. A further, horizontal interconnect channel, HIC 190 is schematically represented by multi-length lines drawn above SLB 140. VIC's 160, 170 are mirror-wise symmetrical with respect to one another. SLB 140 forms the center of this mirror symmetry. VIC 160 includes a plurality of different-purpose interconnect resources. These resources include one or more maximum-length broadcast lines (MaxL) such as 165. The illustrated MaxL line 165 may be used for broadcasting a signal, without re-routing, along a maximal distance of the device 100 for a given direction (vertical or horizontal). The MaxL line 165 is continuous along its length, meaning that there are no continuity-breaking mechanisms (programmable switches) along its length. This helps to assure that a consistent signal propagation time will be seen along the MaxL line 165 irrespective of device programming (device configuration).

A typical but not sole use for MaxL line 165 is to serve as a low-skew path for control signals such as clock, clock enable, and output enable which are to be broadcast vertically down a column of SLB's (only one shown at 140). In one embodiment, all drive amplifiers that output to the MaxL line 165 have tristatable outputs. Line 119 is an example of such a tristate-to-MaxL connection.

In addition to the MaxL line 165, VIC 160 further includes a plurality of different length lines that are each of a continuous length less than that of MaxL line 165. For example, line 163 is a so-called 8×L or 'octal-length' line which continuously spans the distance of eight SLB's (only one shown at 140). At least one, and typically both, ends of each 8×L line terminate at a switchbox such as represented by the icon at 164. The switchbox 164 includes programmable interconnect points (PIP's) that may be programmably configured into an open or closed circuit state. The closed circuit state may be used for programmably, further-routing signals so they continue to propogate from the end of one 8×L line (163) to another 8×L line or to a line of shorter length. Switchbox-connected lines may run either in the same continuing direction (vertical or horizontal) or orthogonally.

A line of yet shorter continuous length is shown at 162 and designated as a 4×L or "quad-length" line. Such 4×L lines are characterized as running continuously for the length of four SLB's. A further line of yet shorter continuous length is shown at 161 and designated as a 2×L or 'double-length' line. Such double-length lines are characterized as continuously extending for the distance of two SLB's. In one embodiment, every output driver that drives a signal onto a 2×L, 4×L or 8×L line is a non-tristatable driver. Output line 117 is an example of such a connection.

By way of alternate designation, the letter "L" is used to designated a longline or MaxL line as indicated at 175. The letter "O" is used to designate an octal-length line such as indicated at 173. The letter "Q" is used to designate a quad-length line such as indicated at 172. The letter "D" is used to designate a double-length line such as indicated at 171.

Unless otherwise stated, each hollow-circle such as found at 118 represents a PIP (a programmable interconnect point). The signal-carrying lines that enter a PIP continue linearly through the PIP (at least in the schematic) without interruption. The PIP, however, may be activated programmably to either make a connection between its orthogonally crossing lines or leave an opening at that position.

As seen in FIG. 1A, additional PIP's are provided such as at 121 and 122 for selectively coupling an input signal onto line 111 from either 2×L line 161 or 4×L line 162. The selected signal (if any) is then carried by input-term line 111 into a respectively adjacent logic block such as 141. The combination of input line 111 and PIP's 121, 122 define an input-term acquisition means (e.g., a multiplexer) that may be used for selectively acquiring input-term signals from the adjacent interconnect channel and for supplying a so-selected signal (if any) to a corresponding logic block (141).

Each of logic blocks 141–144 can process its respectively acquired input-term signals and generate corresponding result signals. The result signals may be output on lines such as 117 (non-tristate) and 119 (tristatable). The timing of such logic-block processing and/or result-outputting may be controlled by one or more of the common control signals 145' that are generated by the SLB common control section 150 and distributed symmetrically by network 145 to its respective logic blocks 141–144.

Several advantages are obtained from such a layout. Circuit space is conserved because one common control section 150 is used to define and provide control signals 145' to a plurality of logic blocks 141–144. This is in contrast to having a separate control-defining circuit for each of respective logic blocks 141–144. Also, the centralized location of common control section 150 and the symmetry of the control signal distributing network 145 helps to assure that substantially same control signals, with minimal skew differentiation, may be supplied to each of logic blocks 141–144.

This same scheme for acquiring control-originating signals from adjacent interconnect channels (through means such as 147) and distributing centrally-defined, SLB-local, control signals 145' to respective logic blocks 141–144 is repeated in each super logic block (only one shown at 140) so that the arrival of clock pulses and other control signals at each logic block may be tightly synchronized.

An additional feature of the embodiment of FIG. 1A is that input-term acquisition PIP's such as 121–122 and control signal acquisition PIP's such as those shown at 127 are positioned close to the SLB 140. The extension of multiplexer line 147 over the adjacent VIC 160 (or HIC 190, which extension is not shown) is such that the path from the VIC (or HIC) to the corresponding logic block 141–144 is essentially the same irrespective of whether the signal was sourced on a longline such as line 165 or on a shortline such as 2×L line 161.

Yet another feature of the layout shown in FIG. 1A is that switchbox PIP's such as shown at 164 are symmetrically located near the corners of the SLB 140. The combination of SLB 140 and the corner-located switchboxes (164) and the side-adjacent signal-acquiring multiplexers 111/121–122, 147/127, defines a symmetrical and tileable structure that may be repeated across device 100. (See the further examples of FIGS. 2 and 3.)

Figure 1B:
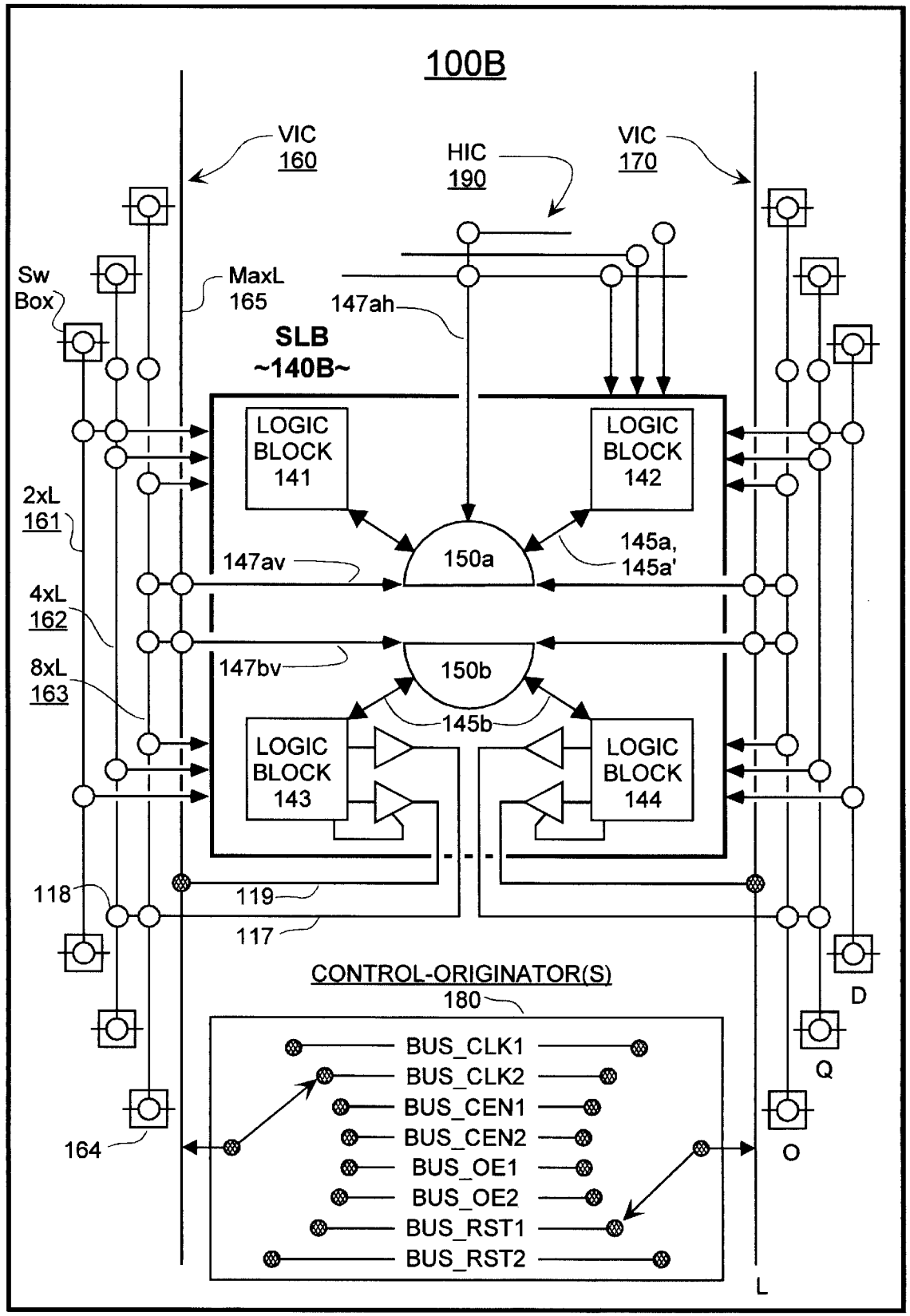
FIG. 1B shows a second example of a super logic block (SLB) with a plurality of symmetrically-split, common control sections.

FIG. 1B shows a variation on the theme of FIG. 1A. Same reference symbols are used where appropriate. The main difference is that instead of having a single common control section 150 for this alternate SLB 140B, there are two centrally (similarly) located common control sections, 150*a* and 150*b*. The upper common control section 150*a* services upper blocks 141 and 142 while the lower common control section 150*b* services lower logic blocks 143 and 144. Mirror symmetry exists between the upper combination of 150*a*, 141–142 and the lower combination of 150*b* and 143–144 such that these two combinations may be used interchageably.

Each common control section (e.g., 150*a*) includes first acquisition means (147*av*) for acquiring control-originating signals supplied from an adjacent VIC 160 and a second acquisition means (147*ah*) for similarly acquiring control-originating signals supplied from the adjacent HIC 190. Because the control-acquiring sections 147*av* and 147*bv* of respective sections 150*a* and 150*b* are separate, each common control section 150*a*, 150*b* may be configured to operate independently and differently from that of its counterpart. Alternatively, sections 150*a* and 150*b* may be programmably configured to operate the same so that the embodiment of FIG. 1B functions essentially the same as does that of FIG. 1A, namely with a singular common control section 150. As should be apparent, the respective control distribution networks 145*a* and 145*b* of the upper and lower control sections 150*a*, 150*b* are mirror symmetrical with one another so as to provide essentially same timings for the control signals 145*a*' and 145*b*' distributed to their respective logic blocks.

Figure 1C:
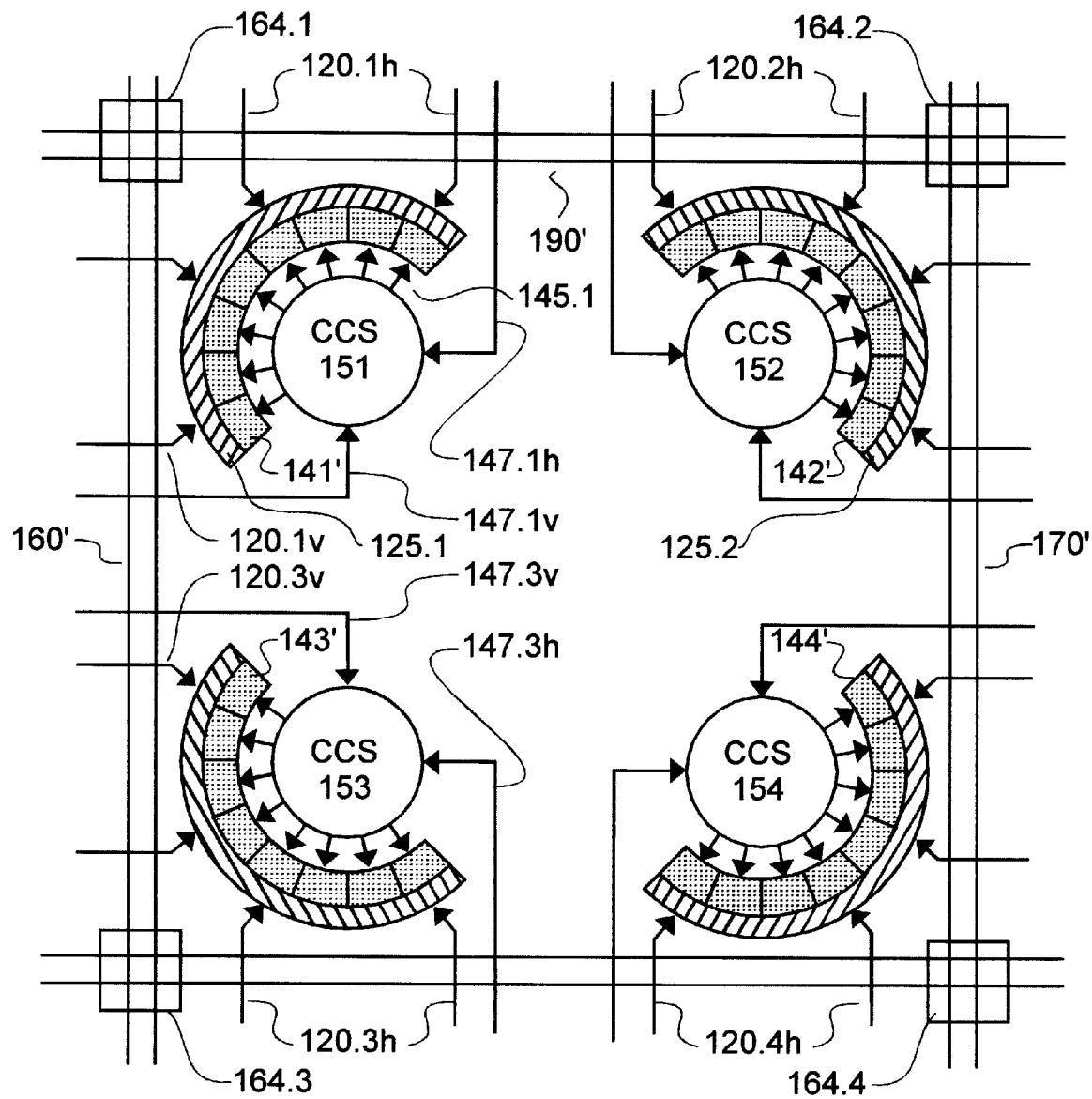
FIG. 1C illustrates a more generalized third example of a super logic block (SLB) having four common control sections each symmetrically surrounded by a set of logic blocks, where the SLB is surounded by inteconnect channel sections.

FIG. 1C illustrates the furtherance of the symmetrically split, control concept. Partial-donut section 141' represents a first set of plural logic blocks that are symmetrically disposed about a first common-control section (CCS) 151. Partial-donut section 125.1 represents an input-terms decoding layer that interfaces with the first set of logic blocks 141'.

Line 120.1v represents a plurality of input-term acquiring means that extend from across an adjacent interconnect channel 160' (a VIC) to the corresponding input-terms decoding layer 125.1 for providing to layer 125.1 the selectively acquired signals. Decoding layer 125.1 can be configured to perform a limited set of decoding functions on the input-term signals acquired from the adjacent interconnect channel 160'. The decoding results may then be supplied to logic blocks set 141' for more complicated processing (e.g. lookup table transformations). Lines 120.1h represent a second plurality of similar input-term acquiring means that extend from across an adjacent second interconnect channel 190' (a HIC) to the input-terms decoding layer 125.1 for providing to layer 125.1 further, selectively acquired, input-term signals from the adjacent interconnect channel 190'. Decoding layer 131 is programmably configurable to either pass the acquired input-term signals provided by each of means 120.1v and 120.1h without modification to the logic blocks set 141' or to perform a programmably-defined decoding function on the acquired input-term signals before passing the decoding results to logic blocks set 141'. Such programmably-selectable decoding functions are described in detail in at least one of the above-cited, copending applications.

Line 147.1v represents a plurality of control acquiring means that extend from across the adjacent interconnect channel 160' (VIC) to the first common-control section (CCS) 151. Means 147.1v functions to selectively acquire control-origin signals from the adjacent interconnect channel 160' and to supply the selectively acquired signals to the first common-control section 151. Line 147.1h represents a second plurality of similar control acquiring means that extend from across the adjacent interconnect channel 190' (HIC) to the first common-control section 151. Means 147.1h functions to selectively acquire control-origin signals from the adjacent, horizontal interconnect channel 190' (HIC) and to supply the selectively acquired signals to CSS 151. The first common-control section 151 processes the selectively acquired control-origin signals of acquiring means 147.1v and 147.h in accordance with programmably-provided configuration instructions and produces therefrom a common set of control signals for uniform distribution to the first set of logic blocks 141'. Radially-extending lines 145.1 represent the distribution network that uniformly distributes the common control signals to the first set of logic blocks 141'.

Rectangular area 164.1 represents a first set of switching resources, provided at the intersection of VIC 160' and HIC 190'. These switching resources 164.1 provide programmably-defined routing functions for continuing the propagation of signals from one interconnect line to a next.

As seen in FIG. 1C, the northwest quadrant structure that is occupied by the first switch box area 164.1 and the first common-control section 151 is mirror-wise and symmetrically replicated three times more to define counterpart quadrant structures in the northeast, southwest and souteast corners having respective second through fourth common-control sections 152, 153 and 154.

The four mirror-wise symmetric, quadrant structures may be identically configured so as to operate essentially one unit having a central CSS, in accordance with FIG. 1A. Alternatively the northwest (151) and northeast (152) quadrant structures may be identically configured with one configuration while the southwest (153) and southeast (154) quadrant structures are identically configured with a different, second configuration so as to produce the equivalent of the arrangement shown in FIG. 1B. Such identical configurings may be alternatively carried out on a vertical or diagonal basis so as to define yet other, control-distributing arrangements. The control-origin signals and input-term signals are acquired from the adjacent interconnect. Both the adjacent interconnect channels and the switch box areas 164.1, 164.2, 164.3, 164.4 at their intersections are mirror-wise symmetrical in terms of programmbly-available resources such that essentially same input-term and control-origin signals may be routed with equivalence to any or all four sides (north, south, east, west) of the super structure. More particularly, a control-origin signal that is present on a continuous line within VIC section 160' may be simultaneously and equivalently transmitted via control-acquiring means 147.1v and 147.3v to respective CCS 151 and CCS 153 so that logic block sets 141' and 143' can operate in essentially-identical synchronism with one another (provided CCS's 151 and 153 are similarly configured). Similarly, a control-origin signal that is present on a continuous line within HIC section 190' may be simultaneously and equivalently transmitted via control-acquiring means 147.1h and 147.2h to respective CCS 151 and CCS 152 so that logic block sets 141' and 142' can operate in essentially-identical synchronism with one another (provided CCS's 151 and 152 are similarly configured). The input-terms of the respective quadrant structures, can but do not have to be the same.

Figure 2:
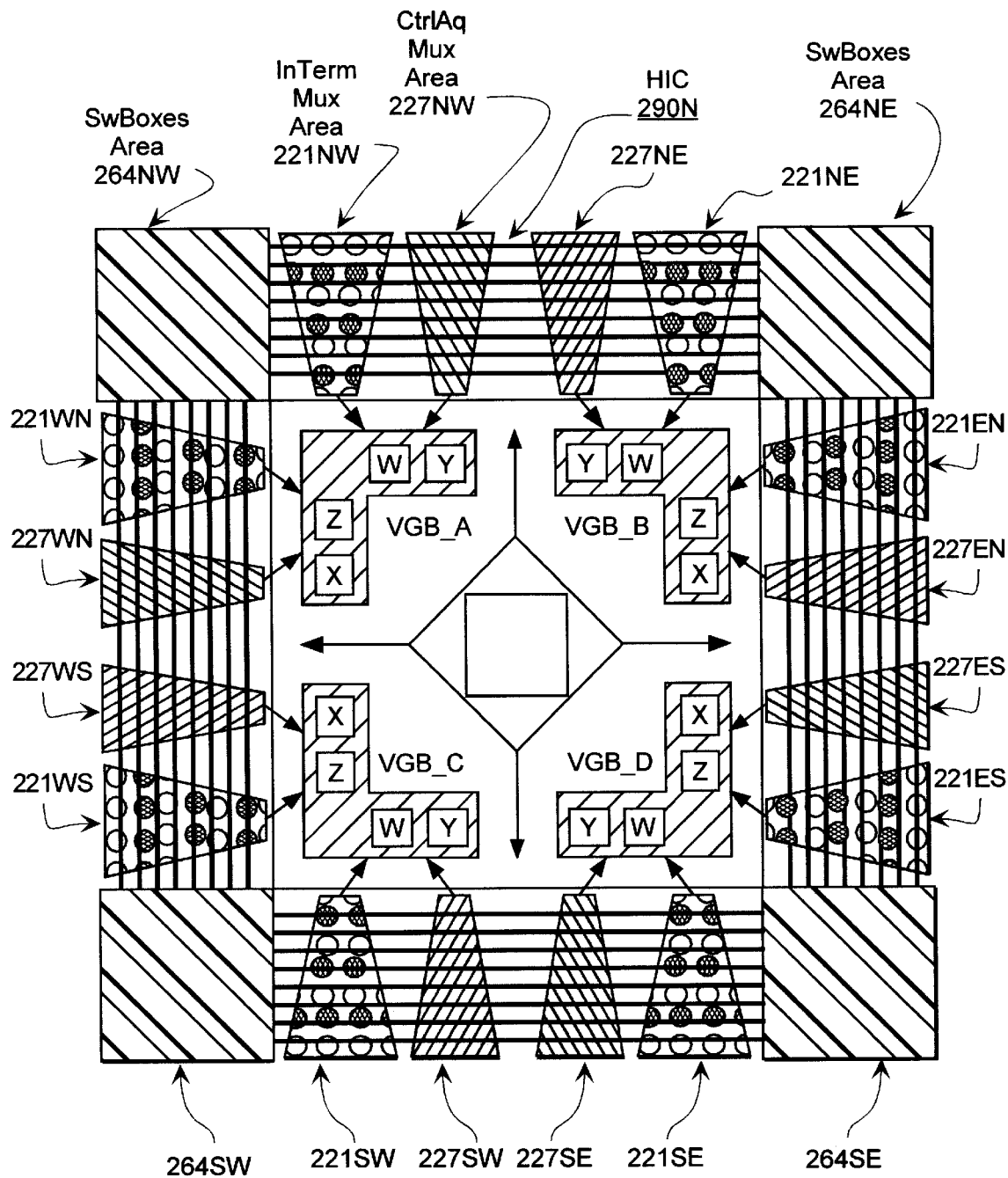
FIG. 2 schematically illustrates a first physical layout of a tile structure having four, wedged-together VGB's (Variable Grain Blocks) surounded by inteconnect channel sections, where a symmetrical distribution of control-acquiring multiplexers extend over the inteconnect channel sections.

FIG. 2 illustrates the layout of a square tile 200 in accordance with the invention. Tile 200 includes four variable grain blocks, namely VGB_A, VGB_B, VGB_C and VGB_D, arranged as shown in mirror symmetry to one another. Each VGB includes a plurality of at least four logic blocks. These logic blocks are referred to as configurable building blocks (CBB's) and are respectively denoted as X, Z, W and Y. Each set of X, Z, W and Y CBB's corresponds to a mirrored set of logic blocks such as 141' of FIG. 1C.

Figure 5:
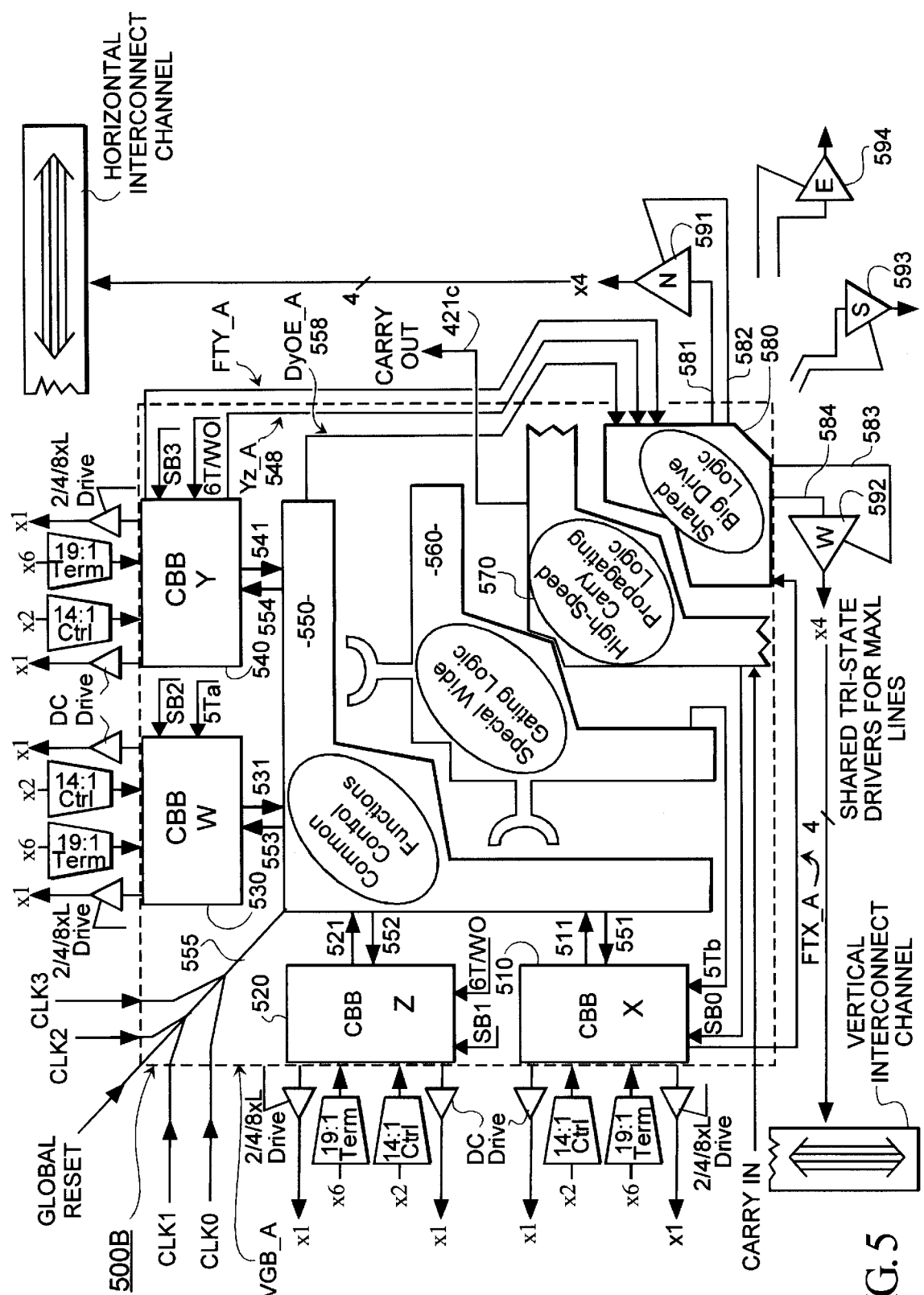
FIG. 5 schematically illustrates details of a VGB in accordance with the invention.
Figure 7:
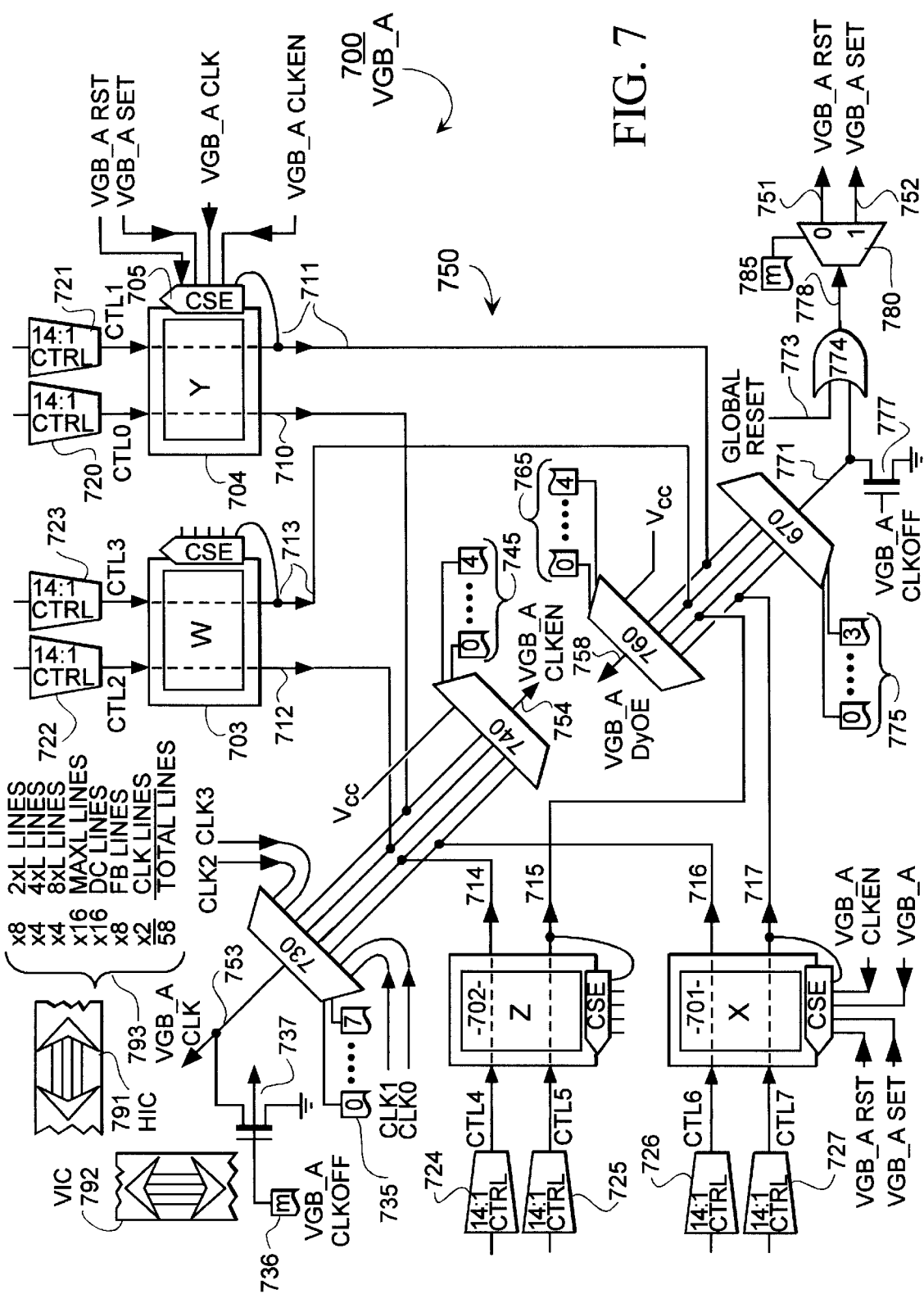
FIG. 7 is a schematic of a common control section that may be provided within the VGB of FIG. 5.

Although not shown in FIG. 2, it is to be understood that each VGB includes a respective common control functions section such as 550 shown in FIG. 5. A more detailed embodiment of such a common control section is seen in FIG. 7.

The northwest, northeast, southwest and southeast quadrant structures of FIG. 2 correspond to the more generalized ones of FIG. 1C. In FIG. 2, trapezoids 221NW and 221WN are schematic representations for like-disposed rectangular areas (not shown) that contain input-term acquiring multiplexers. The input-term acquiring multiplexers of area 221NW selectively acquire and provide input-term signals to a decoding layer (not shown) of CBB's W and Y in VGB_A. CBB's W and Y may be configured to operate in unison as a dual-CBB with higher functional capabilities. In such a case, the input-term acquiring multiplexers of area 221NW services the W/Y dual-CBB. In similar fashion, the input-term acquiring multiplexers of area 221WN selectively acquire and provide input-term signals to a decoding layer (not shown) of CBB's Z and X in VGB_A. CBB's Z and X may be configured to operate in unison. Such folding-together of CBB's is described in detail in at least one of the above-cited, copending applications.

The northwest quadrant structure of FIG. 2 further includes switch boxes area 26NW, VGB_A, and the interconnect lines that run adjacent to VGB_A and that enter into switch boxes area 26NW. An interconnect line does not necessarily terminate in the switch boxes area 26NW merely because it enters it. Some lines pass through. A structure for the passing-through lines and switch boxes area is described in detail in at least one of the above-cited, copending applications.

Figure 6:
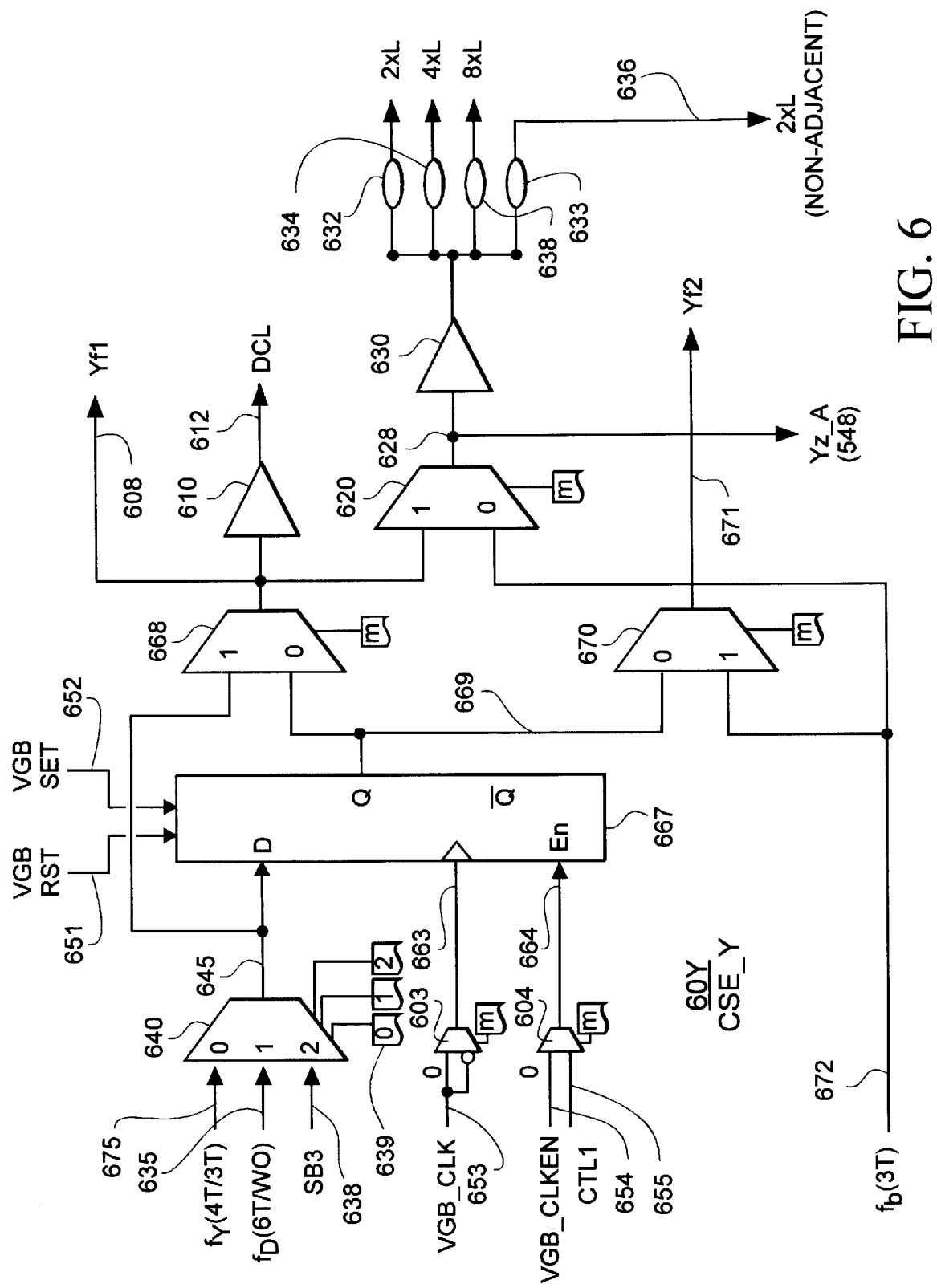
FIG. 6 is a schematic of a commonly-controlled, output sequencing section (CSE) that may be provided within the VGB of FIG. 5.

Each CBB of FIG. 2 includes a configurable sequential element (CSE) such as shown in FIG. 6. The CSE includes a data storing flip-flop 667. Flip-flop 667 receives reset (RST) and set control signals 651 and 652 in addition to clock signal 663 and clock enable signal 664. A locally-derived control signal CTL1 is represented at 655 while the VGB common enable is presented on line 654. Multiplexer 604 is programmably configurable to select one or the other of lines 654, 655 for presentation of the selected input signal onto output line 664. Lines 672, 675, 635 and 638 carry logic block (CBB) result signals which are not directly germane to the present invention. A more detailed explanation of such CBB-result signals may be found in at least one of the above-cited, copending applications.

Three bits of configuration memory are indicated at 639 for controlling multiplexer 640 to select an appropriate data signal 645 for supply to the D input of flip-flop 667. The selected signal may bypass the flipflop by routing through multiplexer 668 to line 608. Multiplexer 668 may be programmed to alternatively apply the Q output of flip-flop 667 to line 608. Buffer 610 drives a direct-connect line 612. Buffer 630 drives one or more of CBB-adjacent 2×L, 4×L or 8×L lines. Connection 636 is to a non-adjacent 2×L line. Items 632, 633, 634 and 638 represent PIP-like, programmable connections for programmably interconnecting their co-linear lines. A more detailed explanation of the CSE structure and its other components may be found in at least one of the above-cited, copending applications.

Referring to FIG. 7, a more detailed view of one embodiment of the common controls developing section 550 for VGB_A is shown. In this embodiment 750, the common control signals include a VGB_A RST (reset) signal 751, a VGB_A SET signal 752, a VGB_A CLK (clock) signal 753 and a VGB_A CLK_EN (clock enable) signal 754. These commonly-produced control signals 751–754 are returned to the Configurable Sequential Elements (CSE's) of each CBB within the corresponding VGB. One such CSE is shown at 705 as part of the Y CBB 704 with the VGB_A RST, VGB_A SET, VGB_A CLK, and VGB_A CLK_EN signals being fed to it. The CSE's of the remaining CBB's 701(X), 702(Z) and 703(W) are understood to receive the same returned control signals 751–754.

In addition to the returned common control signals 751–754, each CSE receives a local control signal from its own CBB. Thus, CSE 705 receives local control signal 711 (which is alternatively denoted as CTL1) from its corresponding Y CBB 704. The CSE of the W CBB 703 similarly receives a local control signal 713 (CTL3). The CSE of the Z CBB 702 similarly receives a local control signal 715 (CTL5). The CSE of X CBB 701 similarly receives a local control signal 717 (CTL7).

Other locally-acquired control signals of the CBB's 701–704 are respectively shown at 716, 714, 712 and 710. These locally-acquired control signals 710–717 are each obtained from locally-adjacent interconnect lines by means of a control-signal acquiring resource (CIE) of the respective CBB. CBB Y (704), for example, is seen to have two 14-to-1 control-acquiring multiplexers 720 and 721. Multiplexers 720 and 721 cross with the locally-adjacent horizontal interconnect channel (HIC) 791 in a partially populating manner. See FIG. 8.

By 'partially populating', it is meant here that HIC 791 contains more interconnect lines than are connected to by any one of multiplexers 720 and 721. Each of multiplexers 720 and 721 contains a unique subset of programmable-interconnect-points (PIP's) that form a partially-filled crossbar with HIC 791 rather than a fully-populated crossbar with HIC 791. Use of such partially-populated crossbars in place of fully-populated crossbars is known in the art. The advantage is reduced capacitive loading on the interconnect lines. The disadvantage is reduced flexibility in choosing which interconnect lines (of HIC 791) will serve as a source for an acquired control signal.

In the illustrated example, HIC 791 (the horizontal interconnect channel) contains the following, super-block-adjacent resources: eight double-length (2×L) lines, four quad-length (4×L) lines, four octal-length (8×L) lines, sixteen full-length (MaxL) lines, sixteen direct-connect (DC) lines, eight feedback (FB) lines and two dedicated clock (CLK) lines. This total of 58 lines is summarized at 793 in FIG. 7.

From among these 58 lines, the two dedicated clock (CLK) lines do not participate in the partially populating scheme of each of multiplexers 720 and 721 or in the partially populating scheme of each of the linearly adjacent, multiplexers 722 and 723. The remaining 56 HIC lines may be subdivided into four unique subsets of 14 lines each (4×14=56). In accordance with the invention, each of control-acquiring multiplexers 720–723 has its respective 14 inputs (MIP's) connected to a respective one of the four unique subsets of lines. Thus, a control-origin signal may be acquired from any one of the locally-adjacent 56 HIC lines by at least one of the adjacent four multiplexers 720–723.

The adjacent vertical interconnect channel (VIC) 792 contains a same mix of interconnect resources (although not the same lines) and further carries the global reset (GR) line. Except for this GR line and the two dedicated CLK lines, the remaining 56 lines of VIC 792 may be subdivided into four unique subsets of 14 lines each. And in accordance with the invention, each of control-acquiring multiplexers 724–727 has its respective 14 inputs (MIP's) connected to a respective one of the four unique subsets of VIC lines. Thus, a control-origin signal may be acquired from any one of the locally-adjacent 56 VIC lines by at least one of the adjacent four multiplexers 724–727. However, it should be understood that once one of four multiplexers 724–727 is consumed for selectively acquiring a first control-origin signal from its unique subset of VIC lines, connection to the remaining lines of that unique subset via that consumed multiplexer is no longer possible.

Figure 8:
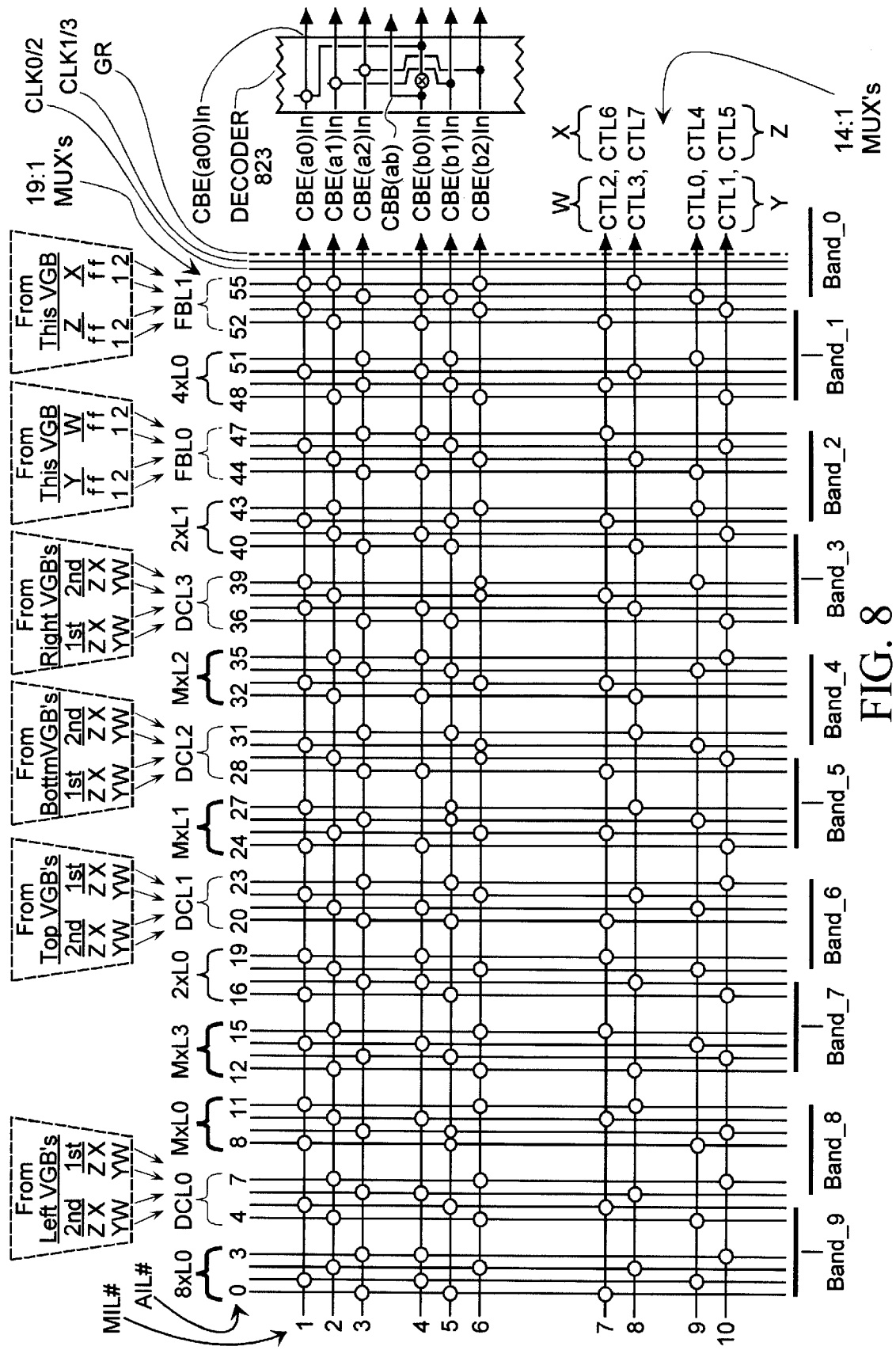
FIG. 8 illustrates the layout of differentiated interconnect lines within a VGB-adjacent channel section and of control-acquiring and input-term acquiring multiplexers extending across the channel section.

FIG. 8 illustrates one partial-populating scheme in accordance with the invention for the 56 lines of each HIC or VIC. It is within the contemplation of the invention to use other partial populating patterns. It is also within the contemplation of the invention to have overlap between acquirable line sets by using control acquiring multiplexers with more MIP's if desired, but of course that also increases space utilization within the integrated circuit. The connection arrangement shown in FIG. 8 illustrates one possible layout arrangement for the various, differentiated conductors of the interconnect channel. This layout organization is formed by spaced-apart, layout 'bands' 0 through 9 as shown at the bottom of FIG. 8. Each band (except 0) has 6 interconnect conductors (AIL's) and generally 2 PIP's per multiplexer input line (MIL). This banded arrangement distributes PIP's such that, except for the localized crowding on MIL lines 5 and 6, most PIP's are not crowded together as immediate neighbors. The relatively homogenous distribution of PIP's within each band helps to minimize consumption of IC substrate area by the corresponding circuit elements.

Note that the lines of band 0 are positioned closest to the side of the corresponding CBB. This helps to minimize the distance that timing-critical signals such as CLK0–3 and GR (global reset) travel from a CBB source before entering into the CSS of a destination CBB. The lines of bands 1 and 2 are positioned successively next closest to the side of the corresponding CBB. This helps to minimize the length of VGB-circumscribing lines, particularly the so-called, feedback lines (of groups FBL0 and FBL1). The quad-length (4×L0) lines may be used to facilitate certain signal-strapping functions of an adjacent decoding layer 823, which is why the 4×L0 lines are also included in band 1. MaxL lines and direct connect lines (DCL's) tend to have substantially larger capacitances than FBL's and 2×L lines. The MaxL lines and DCL's are thus generally relegated to positions in the outer-more ones of bands 3–9 because distance of signal travel from a source CBB to a destination CBB, through one of these larger-capacitance conductors is less critical.

When the PIP-distribution scheme of FIG. 8 is applied to the embodiment of FIG. 7, it is seen that each of the control-signal acquiring multiplexers 720 through 727 (FIG. 7) is capable of acquiring control signals from a unique subset of lines in respective one or the other of HIC 791 and VIC 792. The combination of multiplexers 720 through 727 can therefore acquire control signals from an even larger unique subset of adjacent interconnect lines (AIL's). In accordance with the invention, the control-signal acquiring capabilities of all the peripheral multiplexers 720–727 are made common to the VGB 700.

As such, it is seen that a resource-merging multiplexer 730 is provided in section 750 with eight inputs for respectively receiving the following signals: 714 and 716 (respectively from multiplexers 724 and 726 of the Z and X CBB's), 710 and 712 (respectively from multiplexers 720 and 722 of the Y and W CBB's), CLK0 and CLK1 (directly from VIC 792), and CLK2 and CLK3 (directly from HIC 791). Multiplexer 730 may output a selected one of these eight inputs onto the VGB_A CLK line 753. Alternatively, line 753 may be pulled low by N-channel transistor 737. The gate of transistor 737 is driven by configuration memory bit 736. Signal 736 (VGB_A CLKOFF) is also applied to the gate of a later-described, second transistor 777.

The eight inputs of multiplexer 730 may be independently selected or not in accordance with the setting of eight corresponding configuration memory bits 0 through 7, which bits are indicated at 735. The logic levels on line 753 define the VGB_A CLK signal that is commonly applied to the CSE's of the corresponding VGB_A. When line 753 is pulled low by transistor 737, corresponding flip-flops (not shown) in each of the CSE's (e.g., 705) are blocked from changing state. The resource-merging function of multiplexer 730 allows each of CLK0, CLK1, CLK2 and CLK3 to be viewed as a global clock because it does not matter that its longline runs only horizontally or vertically. Every VGB can acquire a desired one of global clock signals, CLK0, CLK1, CLK2 and CLK3.

A second resource-merging multiplexer 740 is provided in section 750 for also receiving acquired control signals 710 (CTL0), 712 (CTL2), 714 (CTL4) and 716 (CTL6). Multiplexer 740 has a fifth input which receives the Vcc signal (logic 1). Five configuration memory bits 745 may be respectively used to designate which of the inputs of multiplexer 740 will appear on its output line 754 (VGB_A CLKEN_). When line 754 is high (at Vcc), the commonly controlled flip-flops in the CSE's of VGB_A are enabled to respond to the clock signal on line 753.

A third resource-merging multiplexer 770 of section 750 has four input terminals respectively connected to receive the following control signals: 711 (CTL1 from multiplexer 721), 713 (CTL3 from multiplexer 723), 715 (CTL5 from multiplexer 725) and 717 (CTL7 from multiplexer 727). Four configuration memory bits 775 may be respectively used for causing one or none of the four inputs to appear on output line 771. N-channel transistor 777 is further coupled to line 771 for driving line 771 low (to logic 0) when the VGB_A CLKOFF memory bit 736 is high.

Line 771 connects to a first input of OR gate 774. A second input of OR gate 774 receives the global reset signal (GR) by way of line 773. The output of OR gate 774 is applied to an input 778 of de-multiplexer 780. Configuration memory bit 785 controls de-multiplexer 780. If memory bit 785 is in the logic zero state, the dynamic signal on output line 778 appears on output line 751 of the de-multiplexer 780 while output line 752 remains in the inactive, default state (no SET). Conversely, if memory bit 785 is in the logic 1 state, the dynamic signal on output line 778 is transferred to output line 752 (VGB_A SET) while line 751 remains in the inactive, default state (no RESET).

De-multiplexer 780 therefore enables either of the global reset (GR) signal on line 773 or the local reset signal on line 771 to be programmably directed to act as a set or reset signal for the commonly controlled flip-flops (not shown) of all the CSE's in VGB_A 700. The CLKOFF configuration bit 736 can be used to block the local reset signal from appearing on line 771.

A fourth resource-merging multiplexer 760 is provided within section 750 for receiving the following input signals: 711 (CTL1), 713 (CTL3), 715 (CTL5) and 717 (CTL7). Multiplexer 760 additionally receives the Vcc level at a fifth input. Five configuration memory bits 765 determine which, if any, of the five inputs of multiplexer 760 will appear on output line 758 (VGB_A DyOE). The VGB_A DyOE signal 758 is supplied to the shared logic section 580 of the VGB as indicated by 558 in FIG. 5.

Figure 9:
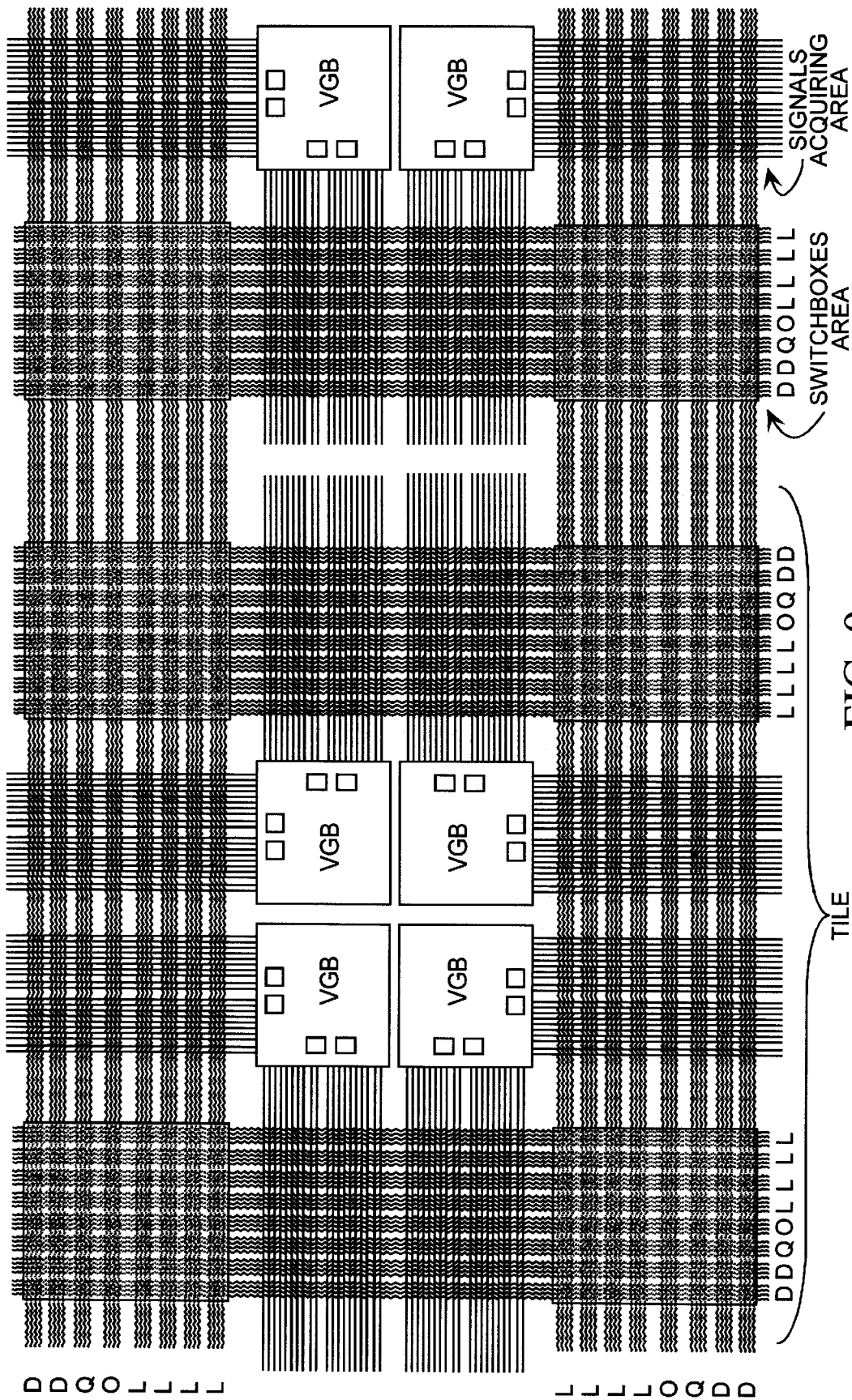
FIG. 9 shows another embodiment of a mirror-symmetric, tileable layout.

FIG. 9 shows another possible layout for the differentiated lines of the interconnect channel sections surrounding each super VGB. Buses designated as 'L' each contain four or more MaxL lines. Buses designated as 'O' each contain four or more 8×L lines. Buses designated as 'Q' each contain four or more 4×L lines. Buses designated as 'D' each contain four or more 2×L lines. DCL's and FBL's are further understood to pass in the channel sections although they are not explicitly shown. The idea to be conveyed by FIG. 9 is that channel resources are layed out in mirror symmetrical fashion about each SVGB (contains 4 VGB's) to provide a symmetrically tileable pattern.

Figure 3:
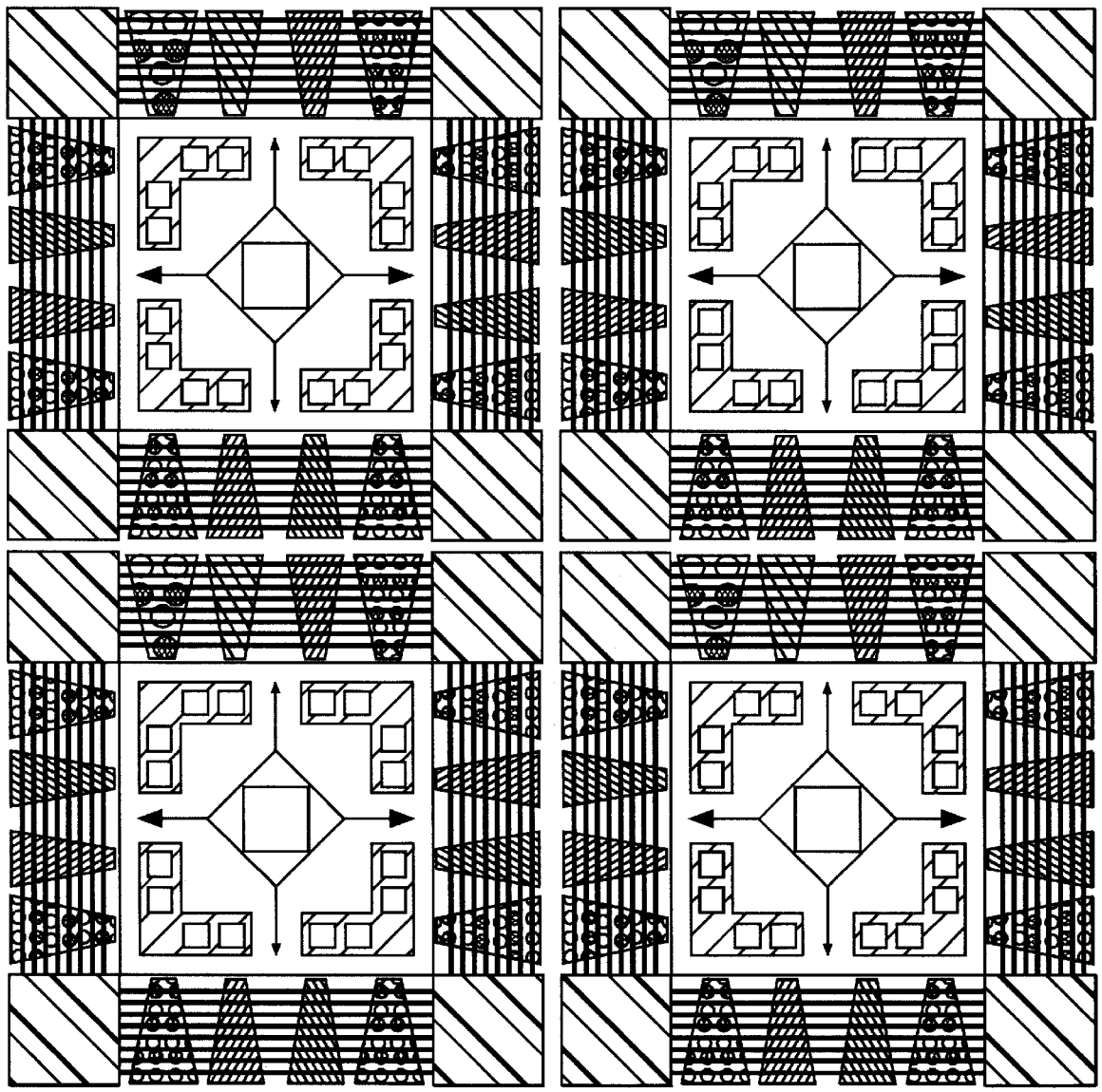
FIG. 3 schematically illustrates how four tile structures of FIG. 2 tile together.
Figure 4:
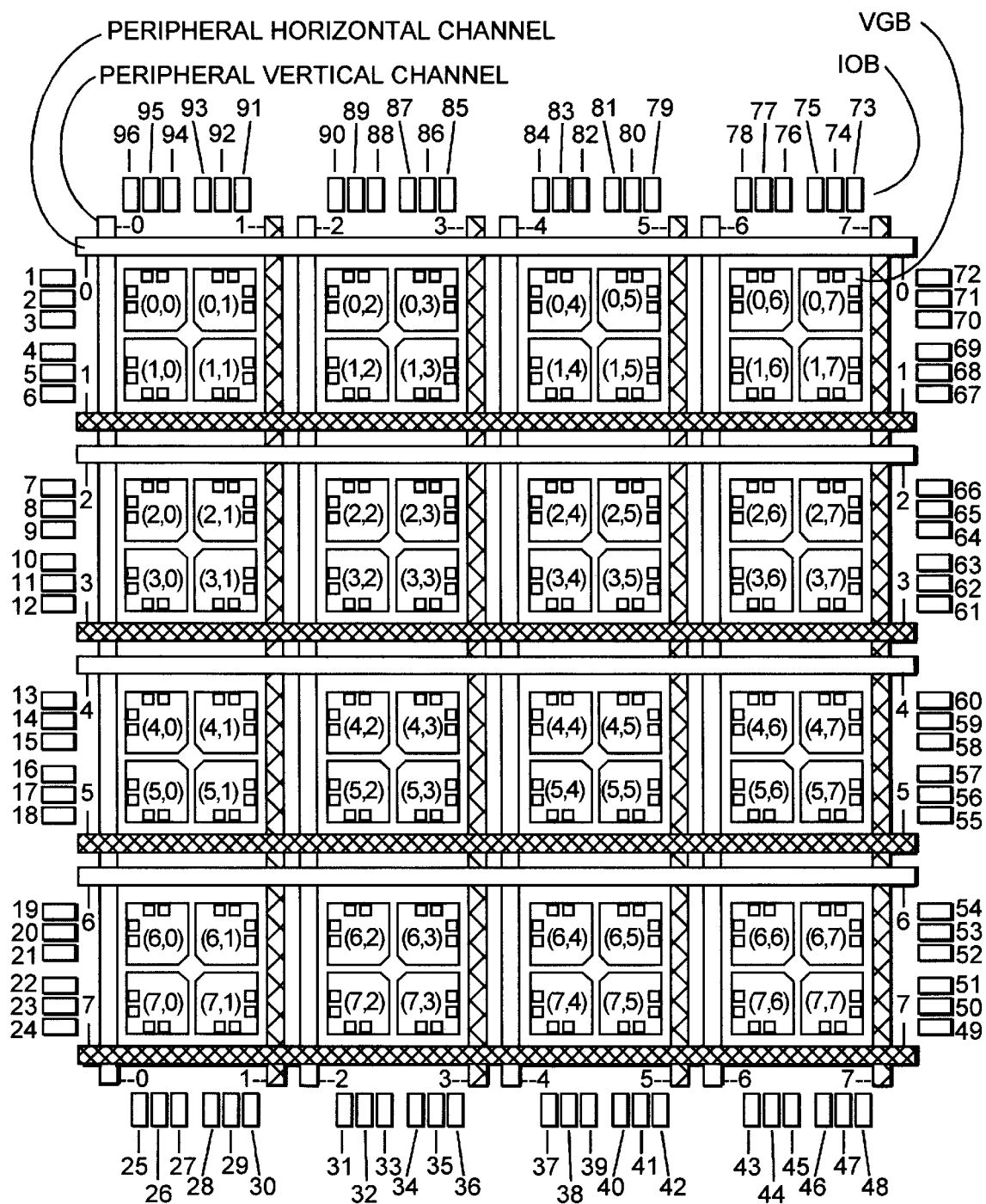
FIG. 4 illustrates the layout of an IC logic-array device having tileable structures in accordance with the invention.

Referring to FIG. 5, various details of a first Variable Grain Block 500 (also referred to as VGB_A) are shown at a more microscopic viewing level than that of the more generic embodiments of FIGS. 2–4. It is understood that the other VGB's, namely, _B, _C and _D of each super-VGB have similar resources arranged in respective mirror-opposed symmetry with those of the illustrated VGB_A.

The common controls developing section 550 collects a first plurality of control signals 511, 521, 531 and 541 from respective CBB's 510 (X), 520 (Z), 530 (W), and 540 (Y). These control signals are acquired by way of respective, controls input multiplexers (14:1 Ctrl) of the respective CBB's X,Z,W,Y. There are two such controls input multiplexers (14:1 Ctrl) dedicated to each CBB. Each pair of controls input multiplexers may be considered part of the CBB to which they are dedicated as are the dedicated direct-connect (DC) drive amplifier, the 2/4/8×L drive amplifier, and the six 19:1 terms input multiplexers (19:1 Term) of each CBB. In FIG. 5C, each CIE such as 542 is shown to be responsible for acquiring one control signal and 3 input term signals from the adjacent interconnect and/or VGB intraconnect resources.

The common controls developing section 550 of FIG. 5 further collects a second plurality of control signals 555 directly from the adjacent horizontal and vertical interconnect channels (HIC and VIC) without using the signal selecting resources of the surrounding CBB's. Signals 555 include GR, CLK0, CLK1, CLK2 and CLK3. CLK0 and CLK1 are clock signals that come directly off the vertical interconnect channel. CLK2 and CLK3 are clock signals that come directly off the horizontal interconnect channel. GR is a Global Rest signal that is universally available to all VGB's and therefore has no directional constraints. It is accordingly shown as coming in diagonally into the VGB. Such diagonal disbursement of the GR signal is not generally the best way to distribute GR. It can be alternatively carried in one or both of the vertical or horizontal interconnect channels. In one embodiment, the GR signal is carried by a dedicated GR longline provided in each of the VIC's.

Common controls developing section 550 processes the collected signals 511, 521, 531, 541, and 555, and then returns corresponding common control signals back to the CBB's as indicated by return paths 551 through 554. In one embodiment, individual return paths 551–554 are replaced by a common return bus that transmits the same returned control signals to all the CBB's of the VGB 500B.

Common controls developing section 550 of VGB_A also produces a 'for-sharing' dynamic control signal 558 (DyOE_A) which signal is forwarded to the super-VGB's shared logic section 580. A portion of this shared logic section 580 is seen in FIG. 5B. It is understood that the common controls sections of the other VGB's within the subsuming super-VGB, namely VGB's: _B, _C, and _D, respectively supply additional for-sharing, dynamic control signals DyOE_B, DyOE_C and DyOE_D (not shown) to shared logic section 580.

Each CBB also directs at least one of its respective output signals to shared logic section 580. Line 548 which feeds signal Yz_A to 580 is an example. It is understood that the remaining CBB's, namely, X, Z, and W of the same VGB_A respectively feed signals Xz_A, Zz_A, and Wz_A to 580. It is further understood that the CBB's of the other VGB's within the subsuming super-VGB, namely VGB's: _B, _C, and _D, respectively supply additional signals of like designations, Xz_J, Zz_J, Wz_J, and Yz_J to their respective sections 580, where _J designates here the respective one of VGB's _B, _C, and _D.

The designation 'DyOE' for signals such as 558 is intended to imply here that such a signal performs an output enabling function and that such a signal additionally performs a dynamic selection function as will be seen later. The designation 'Yz_A' for signals such as 548 is intended to imply here that such a signal may be output by a tri-state amplifier (or another like device having a high-Z/high output-impedance state) such as the illustrated quartet of northern HIC-driving amplifiers 591 and/or such as the illustrated quartet of western VIC-driving amplifiers 592.

Selected ones of the Xz_J, Zz_J, Wz_J, and Yz_J signals may be routed to respective ones of input terminals (e.g., 581 and 584) of the longline driving amplifiers 591 through 594. At the same time, selected ones of the DyOE signals may be routed to respective ones of the output-enable control terminals (e.g., 582 and 583) of the longline driving amplifiers 591 through 594. Shared resources 591 through 594 may thus be used by any of the CBB's for outputting a result signal onto VGB-adjacent longlines. Although FIG. 5B only shows the connections of the respective northern quartet 591 and western quartet 592 of driving amplifiers to the north HIC and west VIC, it is understood that the southern quartet 593 and eastern quartet 594 of driving amplifiers similarly connect to a respectively adjacent, south HIC and east VIC.

As indicated above, FIG. 5 provides a specific example for the construction of a VGB element that may be used in the progressively more generic embodiments of FIGS. 4, 3 and 2 (said progression to more generic moving in the recited order). Similarly, FIG. 6 illustrates a Configurable Sequential Element (CSE) as an example of such a programmably configurable output sequencing element that may be used in the progressively more generic embodiments of FIGS. 5, 4, 3 and 2. And FIG. 7, as explained above, shows a specific construction for a common control functions section 750 such as may be used in the progressively more generic embodiments of FIGS. 5, 4, 3 and 2. Further yet, FIG. 8 similarly illustrates a specific partial-populating scheme such as may be used in the progressively more generic embodiments of FIGS. 5, 4, 3 and 2. The physical layout shown in FIG. 9 of VGB's, interconnect channels and switchbox areas is similarly a specific example of a layout that may be used in the progressively more generic embodiments of FIGS. 5, 4, 3 and 2.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. An integrated circuit device comprising:
   (a) a plurality of super logic blocks (SLB's) wherein each super logic block includes:
      (a.1) one or more sets of uniformly-distributed logic blocks; and
      (a.2) for each such set of uniformly-distributed logic blocks, a common control section that defines and uniformly distributes common control signals for its respective set of logic blocks,
      (a.3) wherein said logic blocks of each commonly-controlled set are arranged in symmetry about their respective common control section such that signal propagating delay from the common control section to each of its respective logic blocks is essentially the same.

2. An integrated circuit device comprising:
   (a) a plurality of super logic blocks (SLB's) wherein each super logic block includes:
      (a.1) one or more sets of uniformly-distributed logic blocks; and
      (a.2) for each such set of uniformly-distributed logic blocks, a common control section that defines and uniformly distributes common control signals for its respective set of logic blocks,
      (a.3) wherein said logic blocks of each commonly-controlled set are arranged in symmetry about their respective common control section such that signal propagating delay from the common control section to each of its respective logic blocks is essentially the same; and
   (b) a respective two or more interconnect buses which are provided to extend adjacent to each super logic block (SLB);

(a.2a) wherein each common control section has control-origin acquiring means associated therewith for acquiring control-originating signals from at least one of the adjacent interconnect buses of the SLB; and (a.2b) wherein each common control section can use its respective, acquired control-originating signals for deriving its common control signals.

3. An integrated circuit device according to claim 2 wherein:

(a.2c) wherein the control-origin acquiring means associated with each common control section has plural control-acquiring means each coupled for acquiring control-originating signals from a respective one of at least two of the adjacent interconnect buses of the SLB.

4. An integrated circuit device according to claim 3 wherein:

(b.1) said two or more interconnect buses have equivalent interconnect lines of differing continuous lengths and/or directional orientations; and (a.2d) each of the plural control-acquiring means is equivalent to the other so that essentially same control-originating signals can be acquired from equivalent interconnect lines in the respective one of the least two, adjacent interconnect buses to which the plural control-acquiring means couple.

5. A tileable circuit for repeated tiling into a programmable logic device (PLD), said circuit comprising:

(a) a plurality of logic blocks disposed in mirror symmetry to one another;

(b) a plurality of interconnect channel sections each having an equivalent plurality of interconnect lines of differing continuous lengths and respective directional orientations, where said interconnect channel sections are disposed in mirror symmetry to one another so as to surround said plurality of logic blocks, (b.1) where pairs of differently-directed ones of the interconnect channel sections extend to intersect, (b.2) each interconnect channel section includes sections of longline conductors which continue into adjoining tileable circuits for thereby broadcasting control or input term signals to a Plurality of so-adjoining tileable circuits, (b.3) each interconnect channel section further includes sections of intermediate length conductors which continue into at least one adjoining tileable circuits and have continuous lengths less than those of the longline conductors, (b.4) each interconnect channel section further includes short length conductors which do not continue into adjoining tileable circuits and which have continuous lengths less than those of the intermediate length conductors; and (c) a plurality of interconnect switch sections each disposed at an intersection of interconnect channel sections, where each of the interconnect switch sections has an equivalent plurality of switching circuits for routing signals between the interconnect lines of the there-intersecting interconnect channel sections, and where the plurality of interconnect switch sections are disposed in mirror symmetry to one another so as to surround said plurality of logic blocks.

6. A method for supplying control signals to plural logic blocks of a logic array device, said method comprising the steps of:

(a) distributing said logic blocks as one or more groups with each group having a uniformly-distributed subset of the logic blocks;

(b) providing for each uniformly-distributed subset of the logic blocks, a common control section that defines and uniformly distributes common control signals for its respective group of logic blocks; and (c) arranging respective combinations of a common control section and its respective group of logic blocks in in essentially similar manners such that, for corresponding control signals, signal propagating delays from the common control section of each combination to each of its respective logic blocks is essentially the same as that another of the similarly-arranged combinations of a common control section and its respective group of logic blocks.

7. A tileable structure for repeated tiling within a programmable logic device (PLD), said tileable structure have a substantially L-shaped boundary portion that is tileable with like, L-shaped boundary portions of alike, tileable structures, and said tileable structure comprising:

(a) a section of a first interconnect channel that extends in a first direction and thereby defines a corresponding first leg of said L-shaped boundary portion, (a.1) wherein said first interconnect channel section contains respective sections of a plurality of continuous first conductors that extend in the first direction, the first conductors including at least:

(a.1a) a first relatively long line for uninterruptedly broadcasting a respective first longline signal in said first direction through a relatively large number of said tileable structures;

(a.1b) a first relatively short line for uninterruptedly conducting a respective shortline signal at least into another adjoined one of said tileable structures, where said first short line is shorter than the first long line and the number of tileable structures through which the first short line extends uninterruptedly is less than the number of tileable structures through which the first long line extends uninterruptedly;

(a.1c) a first intermediate length line for uninterruptedly conducting a respective first intermediateline signal in said first direction at least into two others of said tileable structures, where the length of said first intermediate length line is between the respective lengths of the first short and first long lines and the number of tileable structures through which the first intermediate length line extends uninterruptedly is less than the number of tileable structures through which the first long line extends uninterruptedly but more than the number of tileable structures through which the first short line extends uninterruptedly;

(b) a section of a second interconnect channel that extends in a second direction and thereby defines a corresponding second leg of said L-shaped boundary portion, the second leg intersecting with the first leg to thereby define a corner of said L-shaped boundary portion, (b.1) wherein said second interconnect channel section contains respective sections of a plurality of continuous second conductors that extend in the second direction, the second conductors including at least:

(b.1a) a second relatively long line for uninterruptedly broadcasting a respective longline signal in said second direction through a relatively large number of said tileable structures;

(b.1b) a second relatively short line for uninterruptedly conducting a respective shortline signal at least into another adjoined one of said tileable structures, where said second short line is shorter than the second long line and the number of tileable structures through which the second short line extends uninterruptedly is less than the number of tileable structures through which the second long line extends uninterruptedly;

(b.1c) a second intermediate length line for uninterruptedly conducting a respective intermediateline signal in said second direction at least into two others of said tileable structures, where the length of said second intermediate length line is between the respective lengths of the second short and long lines and the number of tileable structures through which the second intermediate length line extends uninterruptedly is less than the number of tileable structures through which the second long line extends uninterruptedly but more than the number of tileable structures through which the second short line extends uninterruptedly;

(c) a switchbox area disposed at said corner of the L-shaped boundary portion and having one or more of said continuous conductors terminating therein, the switchbox area having programmable interconnect points for programmably continuing flows of respective signals onto next conductors for those of said continuous conductors that terminate in the switchbox area;

(d) a plurality of programmably-configurable logic blocks each capable of carrying out a programmably-specified logic function and outputting a corresponding one or more result signals to at least one of said first and second interconnect channel sections, (d.1) wherein the output result signals of each logic block can be programmably-defined, at least in part, by a supplied set of common control signals; and (e) a common control section that is operatively coupled to said logic blocks for uniformly distributing said common control signals to its respective plurality of logic blocks, wherein said common control section includes:

(e.1) a programmably-configurable, origin-acquiring portion for selectively acquiring control-originating signals from said first and second interconnect channel sections; and (e.2) a programmably-configurable, common controls defining portion for defining said common control signals from said selectively acquired control-originating signals.

8. The tileable structure of claim 7 wherein:

(e.1a) said common control signals include at least one of a register clocking signal, a register resetting signal, a register setting signal, and a register clock-enabling signal.

9. The tileable structure of claim 7 wherein:

(d.2) said logic blocks are programmably foldable-together so as to form more complex function synthesizing units.

10. The tileable structure of claim 7 wherein:

(e.1a) said origin-acquiring portion includes programmable multiplexers for selectively acquiring control-originating signals from at least respective long lines in said first and second interconnect channel sections.

11. The tileable structure of claim 10 wherein:

(e.1b) said programmable multiplexers of the origin-acquiring portion are further able to selectively acquire the control-originating signals from respective short length lines in said first and second interconnect channel sections.

12. The tileable structure of claim 7 wherein:

(c.1) said programmable interconnect points of the switchbox area can be programmed to continue flows of respective signals from terminating conductors of relatively larger length to next conductors of comparatively smaller length, where the continued-to next conductor can extend in the same direction or in a different direction than that of the relatively larger length conductor.

13. The tileable structure of claim 7 wherein:

(e.1a1) said common control signals include at least one register clocking signal; and (a.1d1) the first conductors of the first interconnect channel section further include at least one global clock line for uninterruptedly broadcasting a respective global clock signal through all said tileable structures, the global clock line being longer than said first relatively long line.

14. The tileable structure of claim 13 wherein:

(e.1a2) said common control signals include at least a register resetting signal;

(a.1d2) the first conductors of the first interconnect channel section further include at least one global reset line for uninterruptedly broadcasting a respective global reset signal through all said tileable structures, the global reset line being longer than said first relatively long line.

15. The tileable structure of claim 14 wherein:

(e.1b) said programmably-configurable, origin-acquiring portion can selectively acquire reset control-originating signals from non-global conductors in said first and second interconnect channel sections and from said global reset line; and (e.2b) said programmably-configurable, common controls defining portion can define a common rest signal for its respective logic blocks from a programmably-controlled logical combination of said selectively acquired reset control-originating signals.

16. A repeating structure within a field programmable gate array (FPGA) device, where the FPGA includes an interconnect mesh and where said repeating structure comprises:

(a) a plurality of programmably-configurable logic blocks disposed adjacent to a respective part of the interconnect mesh, wherein each said logic block is capable of carrying out a respective and programmably-specified logic function on input term signals respectively acquired from the adjacent interconnect and of outputting a corresponding one or more result signals to the adjacent interconnect, (d.1) wherein the output result signals of each logic block can be programmably-defined, at least in part, by a supplied set of common control signals; and said repeating structure further comprises (b) a common control section that is operatively coupled to said logic blocks for uniformly distributing said common control signals to its respective plurality of logic blocks, wherein said common control section includes:

(b.1) a programmably-configurable, origin-acquiring portion for selectively acquiring control-originating signals from said adjacent interconnect; and (b.2) a programmably-configurable, common controls defining portion for defining said common control signals from said selectively acquired control-originating signals.

17. The repeating structure of claim 16 and further where:
(c) said adjacent interconnect includes a first continuous line extending through at least first and second instances of said repeating structure, the first continuous line being able to carry a correspond, first control-originating signal;
(b.1a) the respective origin-acquiring portions of the first and second instances are programmably-couplable to said first continuous line by respective and substantially identical coupling means so that the respectively acquired versions of the first control-originating signal are essentially in synchronism when they respectively reach the respective common controls defining portions of the first and second instances; and
(b.2a) the respective common controls defining portions of the first and second instances are programmably-configurable to define synchronized and respective common control signals from their respectively received versions of the first control-originating signal.

18. The repeating structure of claim 16 wherein said common control signals include at least one of a register clocking signal, a register resetting signal, a register setting signal, and a register clock-enabling signal.

19. The repeating structure of claim 18 wherein each logic block includes a respective and programmable, polarity selecting means for receiving a corresponding common control signal and selectively establishing the local polarity of the received common control signal.

20. The repeating structure of claim 18 wherein each logic block includes a respective and programmable, local control selecting means for receiving both a corresponding common control signal and a local control signal and for selectively picking one of said common and local control signals for local use.

21. The repeating structure of claim 16 wherein said common controls defining portion includes:
(b.2a) a first, programmably-configurable, resource-merging multiplexer that receives control signals obtained from differently-directed parts of said adjacent interconnect and selects one of the received control signals for defining a corresponding common control signal.

22. The repeating structure of claim 21 wherein:
(d.2) output result signals of said logic blocks of the repeating structure can be programmably-routed for output to the adjacent interconnect by way of a tristateable line driver; and
(b.2b) said common controls defining portion further includes a second, programmably-configurable, resource-merging multiplexer that receives control signals obtained from differently-directed parts of said adjacent interconnect and selects one of the received control signals for defining a dynamically-changeable, output enable signal for use in controlling an output enable terminal of the tristateable line driver that is used to output to the adjacent interconnect, an output result signal of said logic blocks.

* * * * *

UNITED STATES PATENT AND TRADEMARK OFFICE
CERTIFICATE OF CORRECTION

PATENT NO.     : 6,154,051
DATED          : November 28, 2000
INVENTOR(S)    : Bai Nguyen et al.

It is certified that error appears in the above-identified patent and that said Letters Patent is hereby corrected as shown below:

Column 15,
Line 23, "one of the least" should be -- one of the at least --.

Column 16,
Lines 7-8, "blocks in in essentially" should be -- blocks in essentially --.
Line 15, "have" should be -- having --.
Line 40, "immediateline" should be -- immediate line --.

Column 17,
Line 8, "immediateline" should be -- immediate line --.

Column 18,
Line 35, "rest" should be -- reset --.

Column 19,
Line 5, "correspond" should be -- corresponding --.

Signed and Sealed this

First Day of January, 2002

Attest:

Attesting Officer

JAMES E. ROGAN
Director of the United States Patent and Trademark Office